US010985119B2

(12) United States Patent
    Sasaki (10) Patent No.: US 10,985,119 B2
(45) Date of Patent: Apr. 20, 2021

(54) SEMICONDUCTOR DEVICE

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/486,139

(22) PCT Filed: Mar. 28, 2017

(86) PCT No.: PCT/JP2017/012639
    § 371 (c)(1),
    (2) Date: Aug. 14, 2019

(87) PCT Pub. No.: WO2018/179086
    PCT Pub. Date: Oct. 4, 2018

(65) Prior Publication Data
    US 2020/0235062 A1      Jul. 23, 2020

(51) Int. Cl.
    *H01L 23/66*       (2006.01)
    *H01L 27/02*       (2006.01)
    (Continued)

(52) U.S. Cl.
    CPC .............. *H01L 23/66* (2013.01); *H01L 23/60* (2013.01); *H01L 23/642* (2013.01);
    (Continued)

(58) Field of Classification Search
    CPC ....... H01L 23/60; H01L 23/66; H01L 23/642; H01L 23/645; H01L 2223/6611;
    (Continued)

(56) References Cited

U.S. PATENT DOCUMENTS 9,979,360 B1 * 5/2018 McLaren ................ H01L 24/49
10,003,311 B1 * 6/2018 Canning ................ H01L 23/66
(Continued)

FOREIGN PATENT DOCUMENTS

JP    H10-173136 A    6/1998
JP    2005-039537 A   2/2005
(Continued)

OTHER PUBLICATIONS

International Search Report issued in PCT/JP2017/012639; dated Jun. 20, 2017.
(Continued)

*Primary Examiner* — Jose R Diaz
(74) *Attorney, Agent, or Firm* — Studebaker & Brackett PC (57) ABSTRACT

The present invention includes a first semiconductor chip, a second semiconductor chip, a first inductor, a second inductor, a second capacitor, protective diodes, and a third inductor. A field effect transistor includes a gate terminal, a drain terminal, and a source terminal connected to a ground terminal. The second semiconductor chip includes an input terminal and an output terminal connected in a direct current manner, and includes a first capacitor connected to the input terminal and to the ground terminal. The first inductor is connected between the output terminal and the gate terminal. The second inductor includes a first terminal connected to the input terminal. The second capacitor is connected between a second terminal of the second inductor and the ground terminal. Protective diodes are connected in series in a forward direction, and each has a cathode, and an anode connected to the ground terminal. The third inductor is connected between the cathode and the second terminal.

19 Claims, 6 Drawing Sheets

(51) Int. Cl.
| | |
|---|---|
| *H03F 1/56* | (2006.01) |
| *H03F 3/21* | (2006.01) |
| *H01L 23/60* | (2006.01) |
| *H01L 23/64* | (2006.01) |
| *H01L 29/872* | (2006.01) |
| *H01L 29/861* | (2006.01) |
| *H01L 23/00* | (2006.01) |
| *H01L 25/16* | (2006.01) |
| *H01L 49/02* | (2006.01) |
| *H03F 1/52* | (2006.01) |

(52) U.S. Cl.
CPC ............ *H01L 23/645* (2013.01); *H01L 24/48* (2013.01); *H01L 25/16* (2013.01); *H01L 27/0248* (2013.01); *H01L 27/0255* (2013.01); *H01L 27/0288* (2013.01); *H01L 28/10* (2013.01); *H01L 28/40* (2013.01); *H01L 29/861* (2013.01); *H01L 29/872* (2013.01); *H03F 1/523* (2013.01); *H03F 1/565* (2013.01); *H03F 3/21* (2013.01); *H01L 2223/6611* (2013.01); *H01L 2223/6627* (2013.01); *H01L 2223/6655* (2013.01); *H01L 2224/48137* (2013.01); *H01L 2924/1033* (2013.01); *H01L 2924/13064* (2013.01); *H01L 2924/30111* (2013.01); *H03F 2200/222* (2013.01); *H03F 2200/318* (2013.01); *H03F 2200/387* (2013.01); *H03F 2200/444* (2013.01); *H03F 2200/451* (2013.01)

(58) Field of Classification Search
CPC ........... H01L 2223/6655; H01L 29/872; H01L 29/861; H01L 2924/13064; H01L 27/0248; H01L 27/0255; H01L 27/0288; H03F 1/565; H03F 3/21; H03F 2200/444; H03F 2200/222; H03F 2200/387; H03F 2200/451; H03F 2200/318
See application file for complete search history.

(56) References Cited

U.S. PATENT DOCUMENTS

| | | |
|---|---|---|
| 2003/0011031 A1 | 1/2003 | Brewer et al. |
| 2003/0102923 A1 | 6/2003 | Vickram et al. |
| 2005/0063129 A1 | 3/2005 | Kato |
| 2011/0038087 A1 | 2/2011 | Moronval et al. |
| 2013/0083439 A1 | 4/2013 | Hayakawa |

FOREIGN PATENT DOCUMENTS

| | | |
|---|---|---|
| JP | 2005-117000 A | 4/2005 |
| JP | 2008-311527 A | 12/2008 |
| WO | 03/049281 A1 | 6/2003 |
| WO | 2011/152256 A1 | 12/2011 |

OTHER PUBLICATIONS

Katsuya Kato, et al., A 83-W, 51% GaN HEMT Doherty Power Amplifier for 3.5-GHz-Band LTE Base Stations. Oct. 4-6, 2016, Proceedings of the 46th European Microwave Conference, pp. 572-575, London, United Kingdom.
Office Action issued in JP 2017-537517; mailed by the Japanese Patent Office dated Nov. 14, 2017.

* cited by examiner

SEMICONDUCTOR DEVICE

TECHNICAL FIELD

The present invention relates to a semiconductor device on which an amplifier transistor mainly using a GaN-based HEMT and a pre-match circuit for the amplifier transistor are formed on a GaAs-based semiconductor device.

BACKGROUND ART

In recent years, an electric power amplifier using a GaN-based high electron mobility transistor (HEMT), which makes use of advantages of its wide bandgap to be capable of operation with a higher power supply voltage than a conventional GaAs-based transistor and a Si-based LDMOS transistor, has been becoming widespread also in the field of consumer use. One of the major fields involves an electric power amplifier used in a base station for mobile phones. The GaN-based HEMT is mainly used with operating frequency of approximately 1 to 4 GHz, and is capable of operation with a high power supply voltage around approximately 50 V. Therefore, as compared to a conventional GaAs-based or Si-based transistor, the same output electric power can be implemented by using a transistor having a smaller gate width. As a result, a high gain and capability of highly efficient operation are advantages of the GaN-based HEMT (see, for example, Patent Document 1 or Non-Patent Document 1).

PRIOR ART DOCUMENTS

Patent Documents

Patent Document 1: Japanese Patent Application Laid-Open No. 2008-311527
Patent Document 2: WO 2011/152256
Non-Patent Document 1: 2016 Proceedings of the 46th European Microwave Conference, pp. 572-575, "A 83-W, 51% GaN HEMT Doherty Power Amplifier for 3.5-GHz-Band LTE Base Stations"

SUMMARY

Problem to be Solved by the Invention

Figure 10:
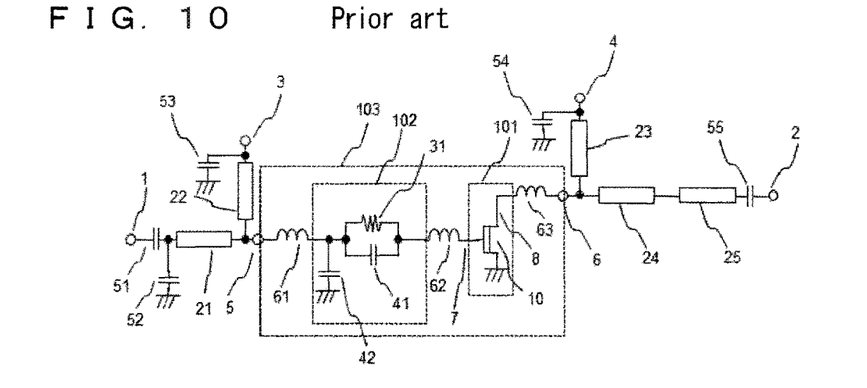
FIG. 10 is a circuit configuration of an amplifier for comparison.

Patent Document 1 and Non-Patent Document 1 describe a typical example of a package product of a GaN-based HEMT used in an electric power amplifier for a base station for mobile phones. FIG. 10 illustrates an example of an equivalent circuit diagram of a single-stage amplifier using the GaN-based HEMT described in Non-Patent Document, and FIG. 11 illustrates an example of a state in which a pre-match circuit 102 and a GaN-based HEMT 101 are mounted in a package 103.

Figure 11:
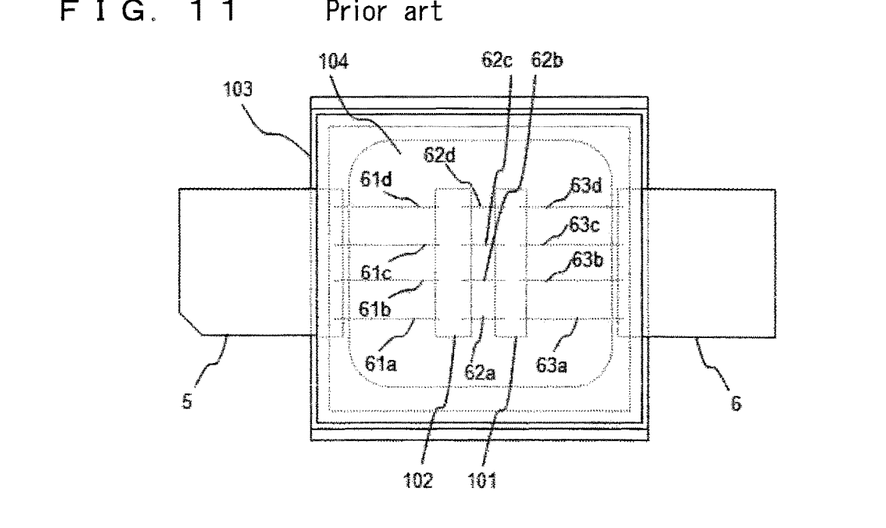
FIG. 11 is a diagram of components mounted inside a package of a GaN-based HEMT incorporating a pre-match circuit according to comparison.

In FIG. 10, 101 denotes a GaN-based HEMT chip, 102 denotes a pre-matching GaAs chip, and 103 denotes a package portion illustrated in FIG. 11. In the GaN-based HEMT chip 101, a GaN-based HEMT (10) is connected in parallel. In the pre-matching chip, a stabilizing resistor 31 and a capacitor 41 are connected in parallel, and a capacitor 42 is connected between a GND and one end of the stabilizing resistor and the capacitor. The GaN-based HEMT chip 101 and a drain terminal 6 of the package 103 are connected with a wire (inductance) 63. The GaN-based HEMT chip 101 and the pre-match chip 102 are connected with a wire (inductance) 62. Another end of the pre-match chip 101 and a gate terminal 5 of the package 103 are connected with a wire (inductance). Usually, a function of the pre-matching chip 102 is to perform impedance conversion of converting a low impedance (several ohms) expecting the transistor side from a gate terminal 7 of the GaN-based HEMT 10 to approximately 5 to over 10 ohms with the aid of the inductor 62 and the capacitor 42. In the amplifier, to implement input matching, a transmission line 21 and a capacitor 52 formed on a print substrate outside of the package 103 further perform impedance conversion to bring impedance to 50 ohms around a desirable fundamental frequency.

An input matching circuit and a gate bias circuit are provided between an input terminal 1 and the gate terminal 5. The input matching circuit includes a DC blocking capacitor 51, the parallel capacitor 52, and the transmission line 21. The gate bias circuit includes a transmission line 22 and a parallel capacitor 53. A gate bias voltage is applied from a gate bias terminal 3 to be applied to the gate terminal 7 of the GaN-based HEMT, via the gate terminal 5. Therefore, the pre-matching GaAs chip 102 includes a function of electrically connecting (conducting DC potential) between the gate terminals 5 and 7 also in a direct current manner.

In contrast, an output matching circuit and a drain bias circuit are provided between an output terminal 2 and the drain terminal 6. The output matching circuit includes a transmission line 24, a transmission line 25, and a DC blocking capacitor 55. The drain bias circuit includes a transmission line 23 and a parallel capacitor 54. The drain bias voltage is applied from a drain bias terminal 4 to be applied to the drain terminal of the GaN-based HEMT, via the drain terminal 6.

As illustrated in FIG. 11, the GaN-based HEMT chip 101 and the pre-matching chip 102 are mounted in the following manner. Specifically, the GaN-based HEMT chip 101 and the pre-matching chip 102 are attached onto a conductive metal, called a base plate 104, with a solder or the like. Subsequently, usually, the gate terminal 5, the pre-matching chip 102, the GaN-based HEMT chip 101, and the drain terminal 6 are connected with a plurality of wires. Wires 61a to 61d of FIG. 11 correspond to the inductance 61 of FIG. 10, wires 62a to 62d to the inductance 62, and wires 63a to 63d to the inductance 63.

The GaN-based HEMT 101 as illustrated in FIG. 10 and FIG. 11 has been productized in reality, and has been used in a base station for mobile phones. However, the GaN-based HEMT 101 has a practical problem in insufficiency in tolerance to electrostatic discharge (ESD) breakdown. For example, many semiconductor integrated circuit products for consumer use have tolerance to ESD breakdown of the human body model (HBM) from 1 kV to 2 kV, whereas not a few GaN-based HEMT products have tolerance to ESD breakdown below 1 kV. This is because many GaN-based HEMT products are not provided with an ESD breakdown protection element.

Figure 12:
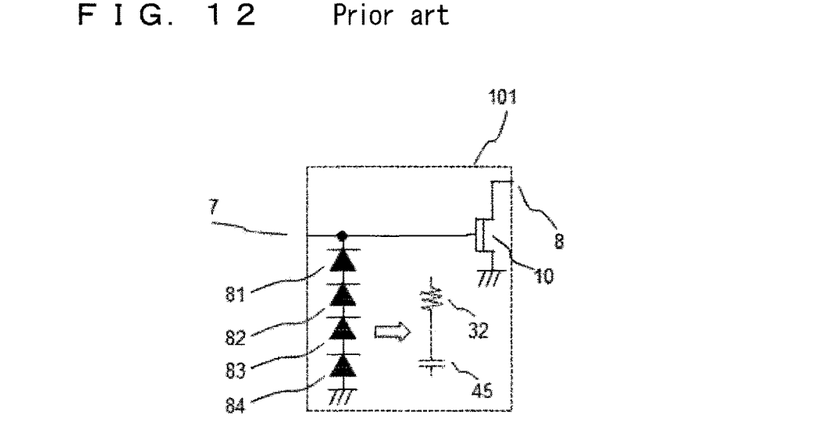
FIG. 12 is an equivalent circuit of a GaN-based HEMT chip incorporating protective diodes according to comparison.

FIG. 12 illustrates an example in which the GaN-based HEMT chip 101 is provided with diodes 81 to 84 for ESD breakdown protection. A reverse breakdown voltage of a Schottky junction between a gate and a source of the GaN-based HEMT for a base station for mobile phones is approximately 200 V, which is considerably low as against a surge of 1 kV. Therefore, it is difficult to satisfy tolerance to ESD breakdown of 1 kV or more, unless some sort of protective function is provided. The protective diodes 81 to 84 provided in parallel between a gate and a source in FIG. 11 bypasses and releases a negative gate surge, and thereby protects junction between the gate and the source. However, a GaN-based HEMT manufactured on a SiC substrate, which is mainly used at present, is expensive, and thus mounting protective diodes increases costs.

Patent Document 1 discloses an example in which the protective diodes 81 to 84 are provided on a chip other than an amplifier transistor chip, for the purpose of reducing cost increase. Formation of protective diodes on a semiconductor chip less expensive than an amplifier transistor chip can achieve addition of a protective function for ESD breakdown and reduction in cost increase. However, with the mounting means of protective diodes described in FIG. 12 and Patent Document 1, a high frequency loss due to parasitic resistance 32 of the protective diodes occurs. Therefore, there has been a problem in that an electric power gain is reduced when an amplifier illustrated in FIG. 10 is configured.

Means to Solve the Problem

A semiconductor device according to the present invention includes a first semiconductor chip, a second semiconductor chip, a first inductor, a second inductor, a second capacitor, at least two protective diodes, and a third inductor. On the first semiconductor chip, a field effect transistor is formed. The field effect transistor includes a gate terminal, a drain terminal, and a source terminal connected to a ground terminal. The second semiconductor chip includes an input terminal and an output terminal connected in a direct current manner, and includes a first capacitor connected to the input terminal and to the ground terminal. The first inductor is connected between the output terminal and the gate terminal. The second inductor includes a first terminal connected to the input terminal. The second capacitor is connected between a second terminal of the second inductor and the ground terminal. The at least two protective diodes are connected in series in a forward direction, and each has a cathode, and an anode connected to the ground terminal. The third inductor is connected between the cathode and the second terminal.

Effects of the Invention

The semiconductor device according to the present invention can achieve a protective function for ESD breakdown with a small number of stages of series protective diodes, and can suppress reduction in an electric power gain, when a GaN-based HEMT chip and a pre-matching chip are mounted.

DESCRIPTION OF EMBODIMENTS

A semiconductor device using a GaN-based HEMT chip and a pre-matching chip according to embodiments of the present invention will be described with reference to the drawings. Including the drawings described in the above, the same or corresponding components are denoted by the same reference signs, and repeating description may be omitted.

FIRST EMBODIMENT

Figure 1:
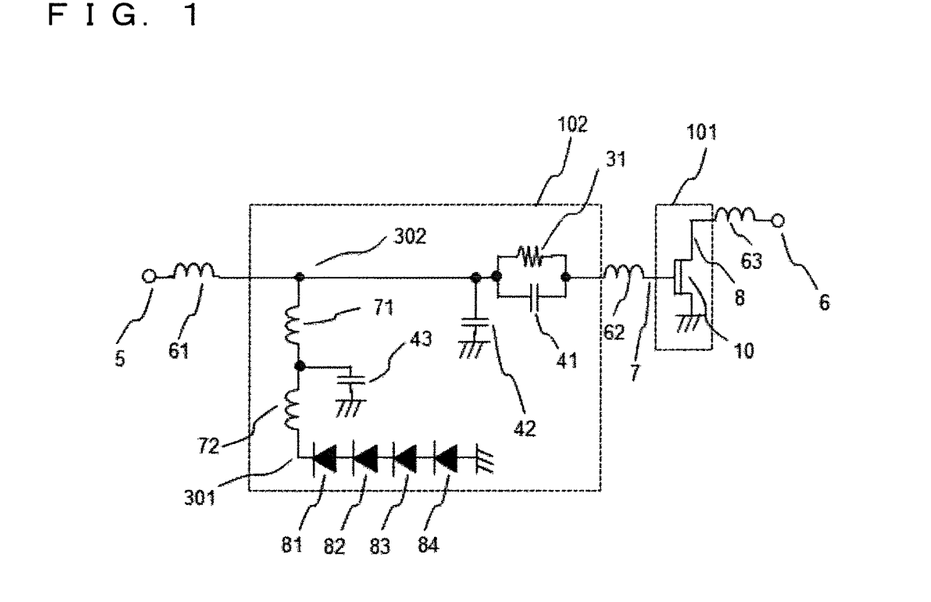
FIG. 1 is a circuit configuration of an amplifier according to a first embodiment.

FIG. 1 illustrates a circuit configuration of a semiconductor device using a GaN-based HEMT chip and a pre-matching GaAs chip according to the first embodiment of the present invention. The scope of the illustration of FIG. 1 corresponds to a circuit inside the package 103 of FIG. 10. The difference from FIG. 10 is that a protective circuit is provided in the pre-matching chip 102. The protective circuit includes inductors 71 and 72, a parallel capacitor 43, and diodes 81 to 84 for ESD breakdown protection (hereinafter referred to as protective diodes). The protective circuit is connected between the gate terminal 5 of the package and the GND. In the protective circuit, sequentially from the gate terminal 5 to the GND, the inductor 71 is connected in series, the capacitor 43 is connected in parallel, the inductor 72 is connected in series, and each of the diodes 81 to 84 is connected in series in a forward direction. The configuration in that the gate terminals 5 and 7 are electrically connected with wiring of the like also in a direct current manner for the purpose of conducting a DC bias voltage is the same as FIG. 10.

When such a negative surge that an electric potential of the gate terminal 7 becomes lower than the source, i.e., the GND potential, is applied between the gate and the source of the GaN-based HEMT 10, and a large reverse bias is applied between the gate and the source, connection is made so that anodes of the protective diodes correspond to the GND side and cathodes of the protective diodes correspond to the gate terminal 5 or 7 side so that the protective diodes 81 to 84 are turned on. Note that, when a positive surge is applied, a surge current flows in a forward direction with respect the Schottky junction between the gate and the source. Therefore, a transistor having a relatively large gate width as in the GaN-based HEMT 10 for an electric power amplifier is rarely broken down due to ESD of approximately HBM of 1 kV that is normally required. For this reason, FIG. 1 does not illustrate protective diodes for a positive surge.

When a Si-based MOSFET is used instead of the GaN-based HEMT 10, a gate oxide film is broken down also with a positive surge because there is no path through which an electric current flows between the gate and the source. Therefore, when a Si-based MOSFET (metal•oxide film•semiconductor gate structure field effect transistor), or a gate of a MIS structure of GaN-based HEMTs is used, it is sufficient that series protective diodes of a reverse polarity be added in parallel to the protective diodes 81 to 84.

The inductor 71, the parallel capacitor 43, and the inductor 72 form a low-pass filter, and is set such that signals of a fundamental frequency or more at the time of operation as an amplifier attenuate in a certain degree (e.g., 6 dB). As a result, as compared to a circuit configuration of a comparative example illustrated in FIG. 2, signals of a fundamental frequency conveyed from the gate terminal 5 to the gate terminal 7 of the GaN-based HEMT are not easily affected by parasitic resistance of the protective diodes due to the low-pass filter. A circuit of FIG. 2 has a circuit configuration corresponding to Patent Document 1 for comparison. Protective diodes 81 to 86 are directly connected to a node 302. As a result, signals conveyed from the gate terminal 5 to 7 are affected by parasitic resistance of the protective diodes 81 to 86, and reduces an electric power gain at the time of amplification operation. In contrast, the configuration of FIG. 1 is not easily affected by parasitic resistance due to the low-pass filter, and can suppress reduction in an electric power gain.

Note that, although the inductors 71 and 72 are connected between the protective diodes 81 to 84 and the gate terminal 5, the inductors 71 and 72 do not affect transient response characteristics of the protective diodes in consideration of the following reason: if it is assumed that the fundamental frequency is 0.8 GHz or more, inductance values of the inductors 71 and 72 are at most several nanohenries to several tens of nanohenries, and a surge of HBM is an order of MHz.

Figure 2:
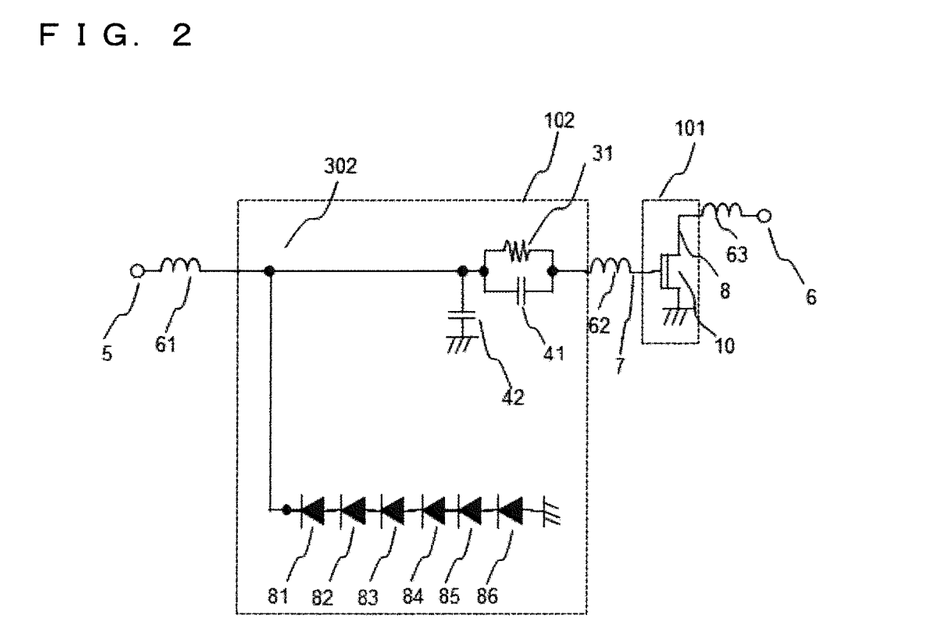
FIG. 2 is a circuit configuration of an amplifier for comparison.
Figure 3A:
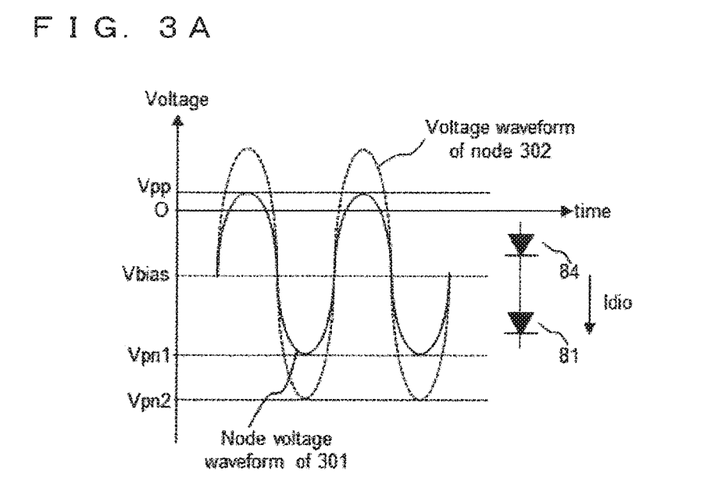
FIG. 3A is a voltage waveform applied to protective diodes according to the first embodiment.
Figure 3B:
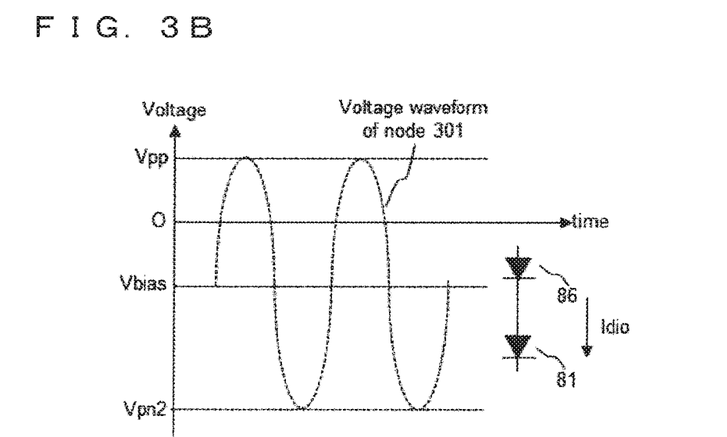
FIG. 3B is a voltage waveform applied to protective diodes according to a comparative example.

The configuration of FIG. 1 also has an effect capable of reducing the number of stages of series diodes, as compared to the comparative circuit of FIG. 2. FIGS. 3A and 3B respectively illustrate a voltage waveform applied to the protective diodes in the first embodiment and the comparative circuit. As illustrated in FIG. 3A, the voltage waveform of the node 301 applied to the protective diodes 81 to 84 attenuate due to the low-pass filter, as compared to the voltage waveform of the node 302 of FIG. 1. The number of stages of the protective diodes is usually set to a smallest number of stages that does not turn the protective diodes on even with a negative peak voltage Vpn1 of FIG. 3A. Specifically, an electric current Idio does not flow also with the voltage Vpn1. For example, in FIG. 3A, when a negative bias voltage Vbias=−1.0 V, a Schottky barrier potential 0.8 V, and negative peak voltages Vpn1=−2.4 V, Vpn2=−3.8 V, four stages is selected as the number of stages that does not turn the diodes on at the node 301, based on 0.7 V×four stages=2.8 V >1−2.4 V1 >0.7 V×three stages=2.1 V.

In contrast, in the comparative circuit of FIG. 2, there is no attenuation of signals due to a low-pass filter, and therefore the negative peak voltage Vpn2 of the node 301 is large (the negative peak voltage Vpn2=−3.8 V). As a result, as illustrated in FIG. 3B, six stages are required as the number of stages of the protective diodes, based on 0.7 V×six stages=4.2 V >1−3.8 VI >0.7 V×five stages=3.5 V.

Therefore, the number of stages of the protective diodes can be reduced in the circuit configuration of the first embodiment. Increase in the number of stages of the series protective diodes increases parasitic resistance. The increase in the parasitic resistance reduces tolerance of the protective diodes having the same junction area to ESD breakdown. In other words, to provide the six-stage series protective diodes with tolerance to ESD breakdown equivalent to that of the four-stage series protective diodes, a junction area 1.5 times as large is required per diode, and this also leads to increase in area occupied by the protective diodes.

Figure 4:
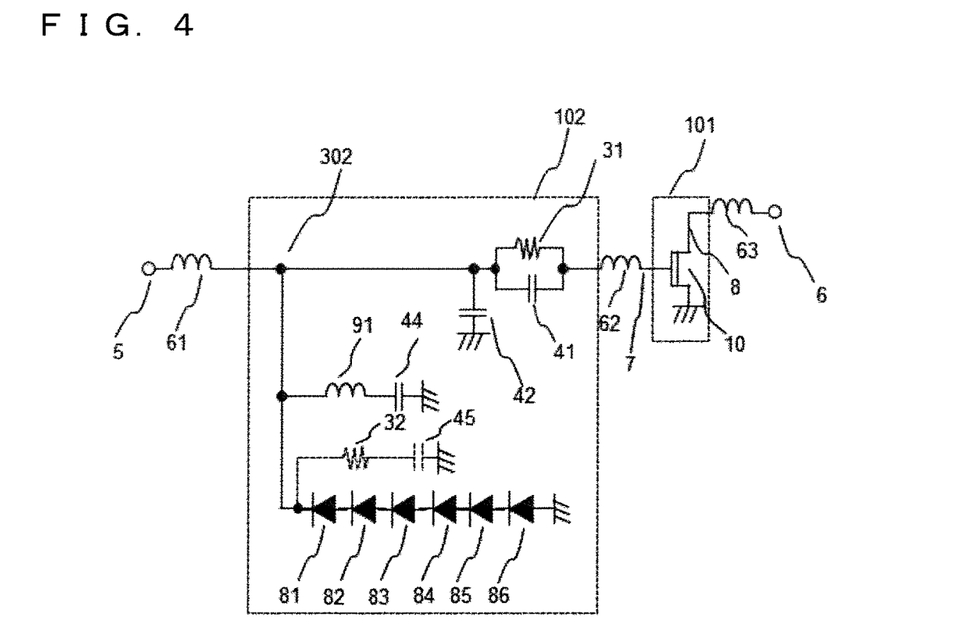
FIG. 4 is another circuit configuration of an amplifier for comparison.

FIG. 4 illustrates a configuration of another comparative circuit to suppress reduction in an electric power gain. This configuration is based on a concept similar to that described in Patent Document 2. In FIG. 4, an inductor 91 and a capacitor 44 connected in series are connected in parallel to the protective diodes 81 to 86 between the node 302 and the GND. The capacitor 44 is a DC blocking capacitor, and may be considered to be short-circuited for a fundamental frequency or more of the amplifier. The resistance 32 and the capacitor 45 denoted by the broken line respectively indicate an equivalent parasitic resistance and an equivalent capacitor of the protective diodes 81 to 86. When the inductance of the inductor 91 is set to resonate in parallel with the capacitor 45 for the fundamental frequency, the impedance of a path seen from the node 302 in the direction of the protective diodes becomes sufficiently higher than the impedance seen from the node 302 in the direction of the gate terminal 7. Therefore, a passing loss of an RF power conducted from the gate terminal 5 of the package toward the gate terminal 7 of the GaN-based HEMT 10 becomes smaller, and thus reduction in an electric power gain can be suppressed. However, actual protective diodes include the parasitic resistance 32, and an electric power loss occurs due to the parasitic resistance 32. Thus, the loss is larger as compared to the configuration of the first embodiment that can reduce the loss generated by the parasitic resistance due to the low-pass filter.

Figure 5:
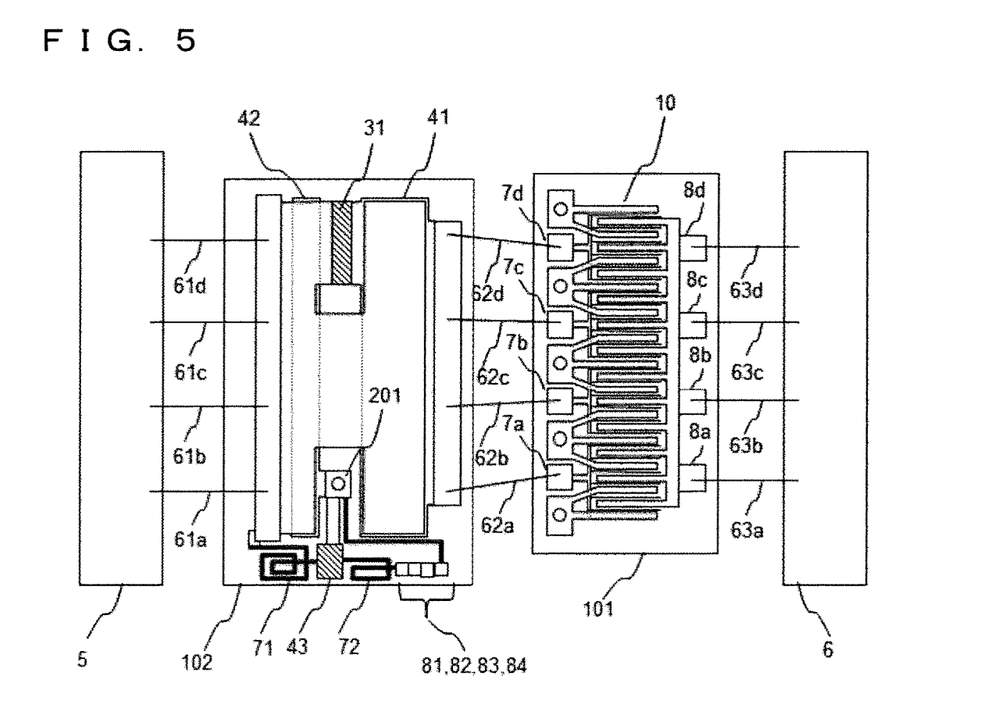
FIG. 5 is a diagram of components mounted inside a package of a GaN-based HEMT incorporating a pre-match circuit according to the first embodiment.

FIG. 5 is an example of a diagram of components mounted inside the package of the GaN-based HEMT incorporating the pre-match circuit according to the first embodiment. The inductor 61 of FIG. 1 corresponds to wires 61*a* to 61*d*, the inductor 62 corresponds to wires 62*a* to 62*d*, and the inductor 63 corresponds to wires 63*a* to 63*d*. A GND of an element on the pre-matching chip 102 is a via hole 201, and is connected to a GND on a chip back surface. A source electrode of the GaN-based HEMT 10 is also similarly connected to a chip back surface through a via hole. The GaN-based HEMT 10 with a large gate width illustrated in FIG. 1 is implemented by connecting a plurality of unit gate widths in parallel, and thus as illustrated in FIG. 5, the GaN-based HEMT 10 in many cases include a plurality of gate terminal pads 7*a* to 7*d* and drain terminal pads 8*a* to 8*d*. A wire is connected to each of the plurality of pads, to thereby achieve the circuit of FIG. 1.

The inductors 71 and 72 are made of spiral inductors that can be formed through a semiconductor process. The capacitors 41 and 42 are made of metal-insulator-metal (MIM) capacitors. The resistance 31 is made of a semiconductor channel resistor or a thin film resistor.

It is desirable that a substrate having high-resistance characteristics be used for the pre-matching chip, considering that RF losses are reduced. It is desirable that the pre-matching chip can be formed through a semiconductor process, considering that the protective diode, inductors, capacitors, resistance, etc. can be formed on the substrate and that those components are manufactured in a small size. The substrate is further required to perform connection with an external GND. A via hole is more desirable than a bonding wire to reduce parasitic inductance occurring at the time of the connection. Thus, a process that can form a via hole is desirable. As a matter of course, a low cost is also an important index. Therefore, for the pre-matching chip, for example, a GaAs substrate, an InP substrate, a SiC substrate, and a high-resistance Si substrate are desirable. The GaAs substrate is excellent in that the GaAs substrate is easily manufactured in many of chemical compound manufacturers, and that the GaAs substrate is relatively inexpensive. The SiC substrate is excellent in that the SiC substrate has low thermal resistance, though being expensive, and that the protective diodes are not easily affected by heat generation of the GaN-based HEMT 10. The high-resistance Si substrate is excellent in that the high-resistance Si substrate is most inexpensive in mass production. The InP substrate is advantageous when a high-speed signal processing circuit or the like is also integrated in the pre-matching chip.

As an example of the protective diode, an example of a GaAs-based Schottky junction diode is described above. This is because the GaAs-based Schottky junction diode is the most popular diode among GaAs-based chips. The protective diode may be a pn junction diode. When a pn junction of a GaAs-based chip is used, a junction barrier potential is approximately 1.2 V, which is higher than the Schottky junction barrier of approximately 0.7 V. Therefore, there is an effect capable of reducing the number of stages of series diodes.

As an example of an amplifier transistor chip, an example of a GaN-based HEMT is described above. This is because a combination of a GaN-based HEMT chip and a pre-matching GaAs-based chip is most suitable in the present invention. Needless to say, similar effects can be achieved also with a GaAs-based FET and a Si-based or SiC-based MOSFET.

As described above, to incorporate protective diodes in a pre-matching inexpensive chip, the semiconductor device according to the first embodiment provides a configuration in which increase in costs due to incorporation of a pre-match circuit and protective diodes in an amplifier GaN-based HEMT chip is reduced. In addition, by connecting the protective diodes through a low-pass filter, the semiconductor device according to the first embodiment achieves a protective function for ESD breakdown with a small number of stages of series diodes, and achieves an effect capable of suppressing reduction in an electric power gain. Therefore, the semiconductor device according to the first embodiment is suitable for an electric power amplifier for a base station for mobile phones, in which cost reduction and performance requirement are difficult.

SECOND EMBODIMENT

Figure 6:
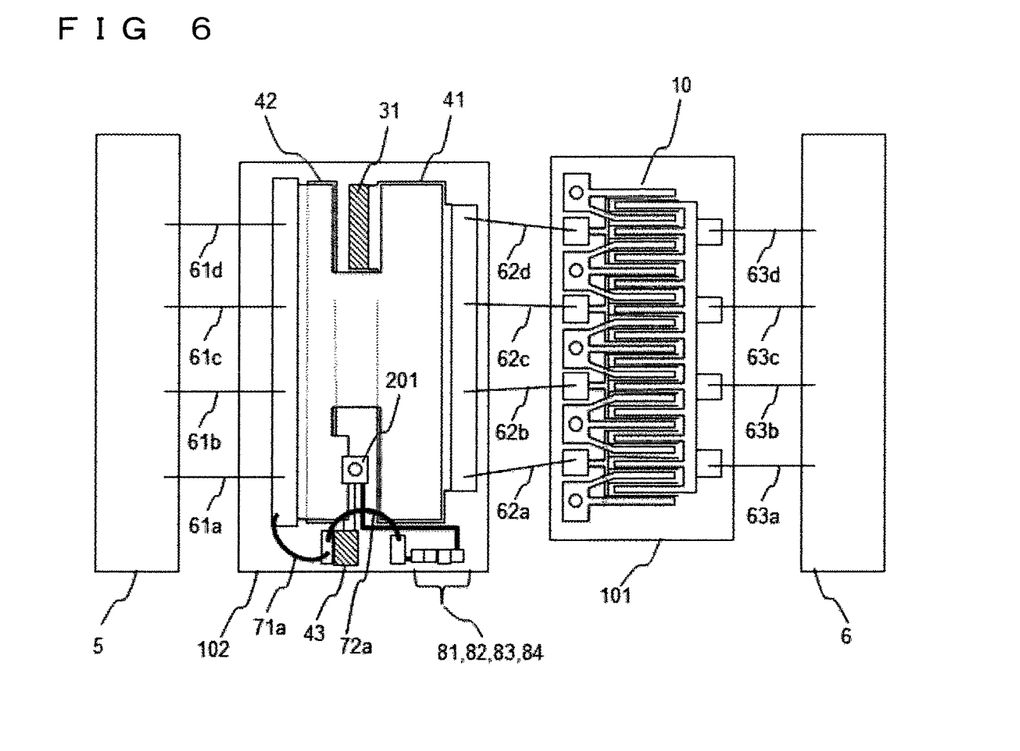
FIG. 6 is a diagram of components mounted inside a package of a GaN-based HEMT incorporating a pre-match circuit according to a second embodiment.

FIG. 6 is an example of a diagram of components mounted inside the package of the GaN-based HEMT incorporating the pre-match circuit according to the second embodiment of the present invention. The difference from the diagram of mounted components of the first embodiment of FIG. 5 is that the inductors 71 and 72 of the pre-matching chip are implemented by bonding wires 71*a* and 72*a*, instead of the spiral inductors. The bonding wire usually has a cross-sectional area of a conductive part larger than that of the spiral inductor, and is thus advantageous in that parasitic resistance is small. Therefore, an electric power loss due to a low-pass filter formed by the inductors 71 and 72 and the capacitor 43 is small, and therefore reduction in an electric power gain in the first embodiment can further be suppressed. As compared to a case of using the spiral inductors occupying a surface of the pre-matching chip, it is also effective in chip area reduction. Other effects are the same as those of the first embodiment.

THIRD EMBODIMENT

Figure 7:
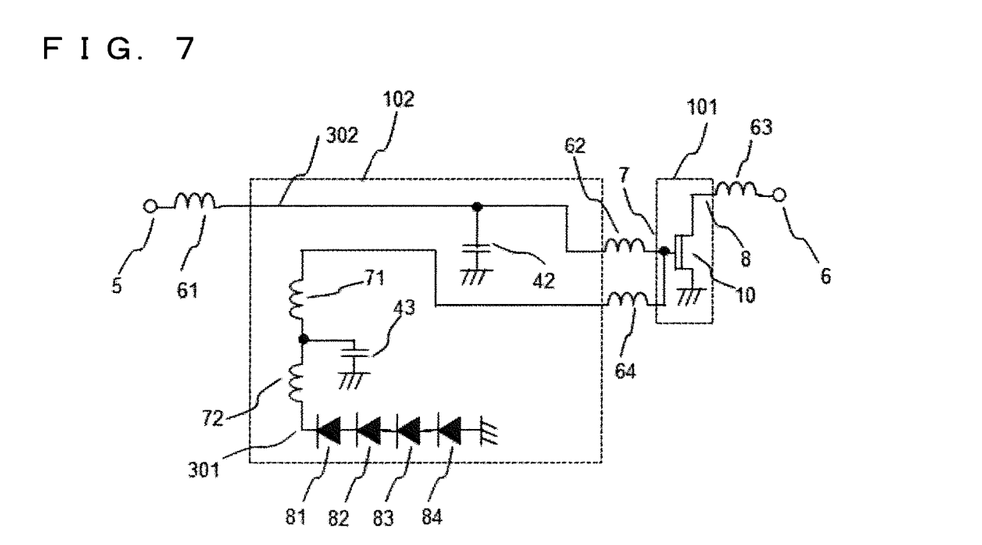
FIG. 7 is a circuit configuration of an amplifier according to a third embodiment.
Figure 8:
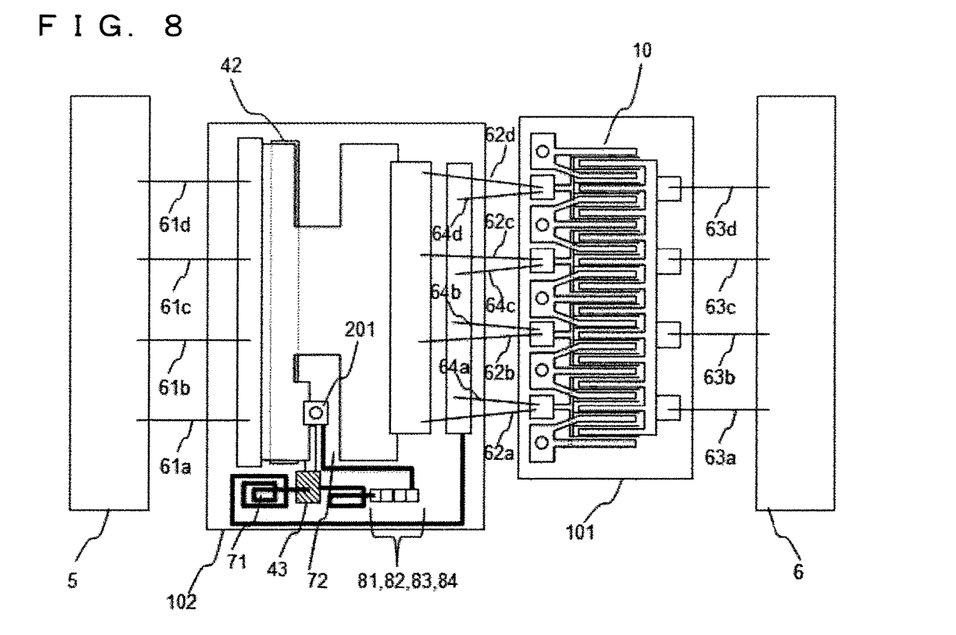
FIG. 8 is a diagram of components mounted inside a package of a GaN-based HEMT incorporating a pre-match circuit according to the third embodiment.

FIG. 7 illustrates a circuit configuration of a semiconductor device using a GaN-based HEMT chip and a pre-matching GaAs chip according to the third embodiment of the present invention, and FIG. 8 illustrates an example of a diagram of components mounted inside the package of the GaN-based HEMT incorporating the pre-match circuit according to the third embodiment. The scope of the illustration of FIGS. 3A and 3B corresponds to a circuit inside the package 103 of FIG. 9, similarly to FIG. 1 of the first embodiment. The difference from the first embodiment is that an inductor 64, other than the inductor 62, is provided from the gate terminal 7 of the GaN-based HEMT 10 toward the pre-matching chip 102, and ahead of that, the low-pass filter (71, 72, 43) and the protective diodes 81 to 84 are connected in series in a forward direction. The stabilizing resistor 31 and the capacitor 41 are not concerned with the essence of the present invention, and are not particularly illustrated. In the diagram of mounted components illustrated in FIG. 8, the inductor 64 is implemented by bonding wires 64*a* to 64*d*. Other part of FIG. 8 is similar to FIG. 5.

At the time of high-efficiency operation of the electric power amplifier, the following configuration is in many cases employed; that is, input and output impedance of the amplifier element is set to certain impedance also for a harmonic in addition to a fundamental frequency. This harmonic processing range is referred to as harmonic termination. In FIG. 7, values of the inductor 64, the inductor 71, and the capacitor 43 are adjusted to set second harmonic impedance seen from the gate end 7 of the GaN-based HEMT 10 to the pre-matching chip 102 side to be sufficiently lower than a fundamental frequency impedance seeing the same direction. With this, efficiency at the time of amplification operation can be higher as compared to a case of not performing harmonic termination.

At this time, influence of the parasitic resistance of the protective diodes 81 to 84 over the fundamental frequency and the second harmonic is reduced due to loading of the inductor 72. Therefore, reduction of an electric power gain due to addition of the protective diodes can be suppressed, similarly to the first embodiment. In the circuit configuration of the third embodiment, the low-pass filter (71, 72, 43) has a function of harmonic termination and also suppresses reduction in an electric power gain due to addition of the protective diodes. Therefore, as compared to a case of adding a harmonic termination circuit to the circuit configuration of the first embodiment, the circuit configuration of the third embodiment also has an effect of area reduction of the pre-matching chip 102. Note that other effects of the protective diodes are the same as those of the first embodiment.

Figure 9:
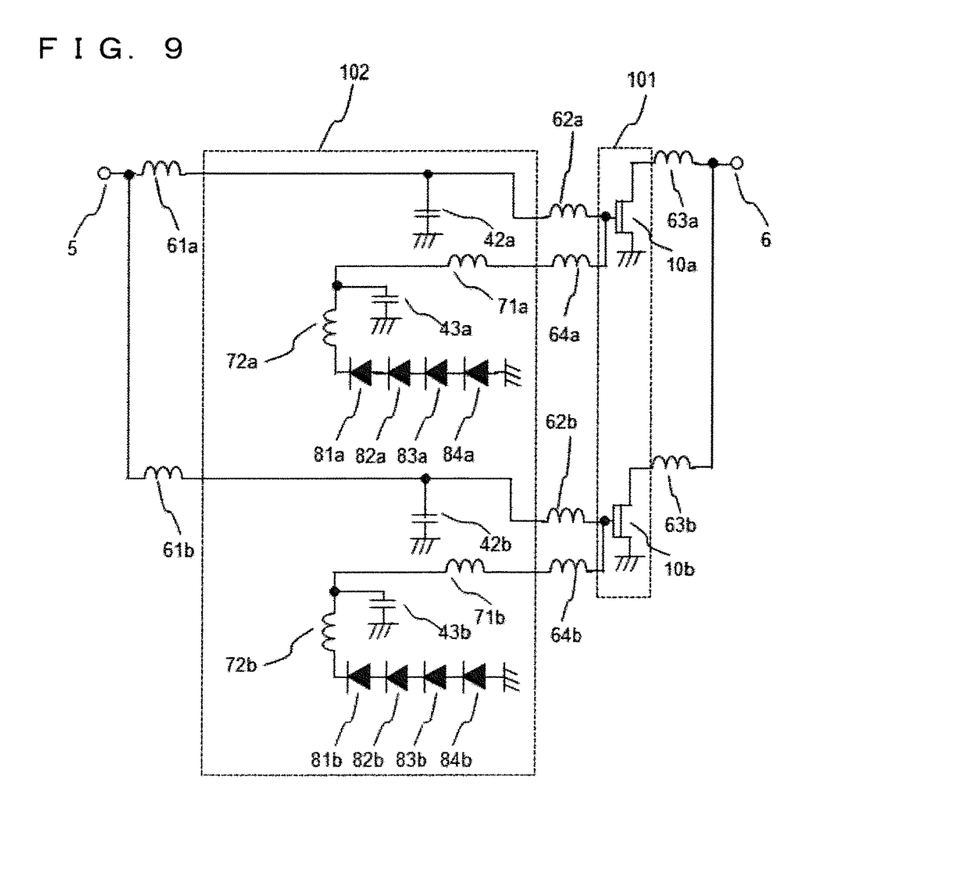
FIG. 9 is a modification example of a circuit configuration of an amplifier according to the third embodiment.

FIG. 9 is an example of a circuit configuration other than FIG. 7 according to the third embodiment. Unlike FIG. 7, the GaN-based HEMT 10 is divided into two transistors 10*a* and 10*b*, and each of the two transistors 10*a* and 10*b* is provided with pre-matching inductors 62*a* and 62*b* and capacitors 42*a* and 42*b* for a fundamental frequency. A path on the harmonic side is also similarly divided into two. Specifically, there are a path of an inductor 64*a*, an inductor 71*a*, a capacitor 43*a*, an inductor 72*a*, and protective diodes 81*a* to 84*a*, and a path of an inductor 64*b*, an inductor 71*b*, a capacitor 43*b*, an inductor 72*b*, and protective diodes 81*b* to 84*b*.

In the diagram of mounted components of FIG. 8, harmonic processing paths are collected together as one by the bonding wires 64*a* to 64*d* to be connected to the inductor 71. In this case, however, a difference is generated between a path length from the wire 64*a* to the inductor 71 and a path length from the wire 64*d* to the inductor 71. When an operation frequency is high, this path length difference may expand the difference of harmonic impedances and may hinder the effect of efficiency improvement. In such a case, divided disposition of paths as in FIG. 9 reduces the difference between the harmonic impedances due to the path lengths, and can enhance the efficiency improvement effect. In FIG. 9, a path is divided into two, but may be further divided and similar effects can still be achieved.

EXPLANATION OF REFERENCE SIGNS

1: Input terminal
2: Output terminal
3: Gate bias terminal
4: Drain bias terminal
5: Gate terminal of package
6: Drain terminal of package
7: Gate terminal of GaN-based HEMT chip
8: Drain terminal of GaN-based HEMT chip
10: GaN-based HEMT
21-25: Transmission line
31-32: Resistance
41-45: Capacitor
51-55: Capacitor outside package
61-64: Inductor made of bonding wire
71-72: Inductor on pre-matching chip
81-86: Protective diode
101: GaN-based HEMT chip
102: Pre-matching chip
103: Outer frame of package
104: Base plate of package for mounting chip
301, 302: Internal node of pre-match circuit

The invention claimed is:

1. A semiconductor device comprising:
a first semiconductor chip including a field effect transistor including a gate terminal, a drain terminal, and a source terminal connected to a ground terminal;
a second semiconductor chip including an input terminal and an output terminal connected to each other with a wire in a direct current manner, and including a first capacitor with one end connected to the wire and another end connected to the ground terminal;
a first inductor connected between the output terminal and the gate terminal;
a second inductor including a first terminal connected to the wire;
a second capacitor formed on the second semiconductor chip, and connected between a second terminal of the second inductor and the ground terminal, the second terminal of the second inductor being a terminal opposite to the first terminal;
at least one protective diode formed on the second semiconductor chip, and having an anode connected to the ground terminal; and
a third inductor connected between a cathode of the at least one protective diode and the second terminal.

2. The semiconductor device according to claim 1, wherein
the field effect transistor is a GaN-based HEMT, and
the second semiconductor chip is made of any one substrate of a GaAs substrate, an InP substrate, a SiC substrate, and a high-resistance Si substrate.

3. The semiconductor device according to claim 2, wherein
the at least one protective diode is a Schottky junction diode or a pn junction diode.

4. The semiconductor device according to claim 2, wherein
the second inductor or the third inductor is a bonding wire.

5. The semiconductor device according to claim 2, wherein
the first semiconductor chip and the second semiconductor chip are mounted in one package.

6. The semiconductor device according to claim 1, wherein
the at least one protective diode is a Schottky junction diode or a pn junction diode.

7. The semiconductor device according to claim 6, wherein
the second inductor or the third inductor is a bonding wire.

8. The semiconductor device according to claim 6, wherein
the first semiconductor chip and the second semiconductor chip are mounted in one package.

9. The semiconductor device according to claim 1, wherein
the second inductor or the third inductor is a bonding wire.

10. The semiconductor device according to claim 9, wherein
the first semiconductor chip and the second semiconductor chip are mounted in one package.

11. The semiconductor device according to claim 1, wherein
the first semiconductor chip and the second semiconductor chip are mounted in one package.

12. The semiconductor device according to claim 1, wherein
the at least one protective diode comprises a plurality of protective diodes, and the plurality of protective diodes are connected in series in a forward direction.

13. A semiconductor device comprising:
a first semiconductor chip including a field effect transistor including a gate terminal, a drain terminal, and a source terminal connected to a ground terminal;
a second semiconductor chip including an input terminal and an output terminal connected to each other with a wire in a direct current manner, and including a first capacitor with one end connected to the wire and another end connected to the ground terminal;
a first inductor connected between the output terminal and the gate terminal;
a second inductor including a first terminal connected to the gate terminal;
a second capacitor formed on the second semiconductor chip, and connected between a second terminal of the second inductor and the ground terminal, the second terminal of the second inductor being a terminal opposite to the first terminal;
a plurality of protective diodes formed on the second semiconductor chip, connected in series in a forward direction, and each having an anode connected to the ground terminal; and
a third inductor connected between a cathode of the plurality of protective diodes and the second terminal.

14. The semiconductor device according to claim 13, wherein
the field effect transistor is a GaN-based HEMT, and
the second semiconductor chip is made of any one substrate of a GaAs substrate, an InP substrate, a SiC substrate, and a high-resistance Si substrate.

15. The semiconductor device according to claim 14, wherein the plurality of protective diodes are a Schottky junction diode or a pn junction diode.

16. The semiconductor device according to claim 14, wherein
the first semiconductor chip and the second semiconductor chip are mounted in one package.

17. The semiconductor device according to claim 13, wherein
the plurality of protective diodes are a Schottky junction diode or a pn junction diode.

18. The semiconductor device according to claim 17, wherein
the first semiconductor chip and the second semiconductor chip are mounted in one package.

19. The semiconductor device according to claim 13, wherein
the first semiconductor chip and the second semiconductor chip are mounted in one package.

\* \* \* \* \*